(12) United States Patent
Subramanian et al.

(10) Patent No.: US 6,335,152 B1
(45) Date of Patent: Jan. 1, 2002

(54) USE OF RTA FURNACE FOR PHOTORESIST BAKING

(75) Inventors: Ramkumar Subramanian, San Jose; Bharath Rangarajan, Santa Clara; Michael K. Templeton, Atherton; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/564,408

(22) Filed: May 1, 2000

(51) Int. Cl.[7] ........................................... G03F 7/38
(52) U.S. Cl. ..................... 430/325; 430/328; 430/330
(58) Field of Search ................................. 430/328, 330, 430/325

(56) References Cited

U.S. PATENT DOCUMENTS

| | | | |
|---|---|---|---|
| 4,952,556 A | * 8/1990 | Mantese et al. | 430/330 |
| 5,238,787 A | * 8/1993 | Haluska et al. | 430/330 |
| 5,359,693 A | 10/1994 | Nenyei et al. | 392/418 |
| 5,714,392 A | 2/1998 | Dawson et al. | 437/8 |
| 5,837,555 A | 11/1998 | Kaltenbrunner et al. | 437/248 |
| 5,849,582 A | * 12/1998 | Chen et al. | 430/328 |
| 5,950,078 A | 9/1999 | Maekawa et al. | 438/149 |
| 5,989,781 A | * 11/1999 | Idacavage et al. | 430/328 |
| 6,100,012 A | * 8/2000 | Shi | 430/330 |
| 6,191,397 B1 | * 2/2001 | Hayashi et al. | 430/330 |

* cited by examiner

Primary Examiner—Richard L. Schilling
(74) Attorney, Agent, or Firm—Amin & Turocy, LLP

(57) ABSTRACT

In one embodiment, the present invention relates to a method of processing an irradiated photoresist involving the steps of placing a substrate having the irradiated photoresist thereon at a first temperature in a rapid thermal anneal furnace; heating the substrate having the irradiated photoresist thereon to a second temperature within about 0.1 seconds to about 10 seconds; cooling the substrate having the irradiated photoresist thereon to a third temperature in a rapid thermal annealing furnace within about 0.1 seconds to about 10 seconds; and developing the irradiated photoresist, wherein the second temperature is higher than the first temperature and the third temperature. In another embodiment, the present invention relates to a system of processing a photoresist, containing a source of actinic radiation and a mask for selectively irradiating a photoresist; a rapid thermal annealing furnace for rapidly heating and rapidly cooling a selectively irradiated photoresist, wherein the rapid heating and rapid cooling are independently conducted within about 0.1 seconds to about 10 seconds; and a developer for developing a rapid thermal annealing furnace heated and selectively irradiated photoresist into a patterned photoresist.

17 Claims, 2 Drawing Sheets

USE OF RTA FURNACE FOR PHOTORESIST BAKING

TECHNICAL FIELD

The present invention generally relates to improving lithography. In particular, the present invention relates to using an RTA furnace to controllably bake a photoresist.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required.

The requirement of small features (and close spacing between adjacent features) requires high resolution lithographic processes. In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Prior to contact with the developer, the irradiated photoresist is baked in a convection oven to promote completely the chemical transformation in the exposed areas of the photoresist. For example, photoresists containing a photoacid generator undergo an acid catalyzed reaction in its radiation exposed areas, and this reaction is facilitated by elevated temperatures. After it is determined that the chemical transformation in the exposed areas is complete, the irradiated photoresist covered substrate is removed from the convection oven and placed on a chill plate. The chill plate serves to lower the temperature of the substrate, which in turn, helps to terminate the chemical transformation in the exposed areas of the photoresist. However, while the heating and cooling promote the chemical reactions within the irradiated photoresist material, current methods of heating and cooling in many instances decrease the critical dimension control of the subsequently developed photoresist. Given the trend toward higher device densities, decreases in critical dimension control are unacceptable when developing new methods of lithography.

Moreover, consistently and accurately patterning features having dimensions of about 0.25 μm or less, and particularly below about 0.18 μm or less, with acceptable resolution is difficult at best, and impossible in some circumstances. Since projection lithography is a powerful and essential tool for microelectronics processing, procedures that increase resolution, improve critical dimension control, and consistently and accurately provide small features are desired.

SUMMARY OF THE INVENTION

The present invention provides improved lithographic methods and systems by controlling the chemical processing within an irradiated photoresist material prior to development. The present invention also provides methods and systems for forming photoresist features having improved critical dimension control. The photoresist features with improved critical dimension control of the present invention are particularly useful for subsequent semiconductor processing procedures and products made with such procedures.

In one embodiment, the present invention relates to a method of processing an irradiated photoresist involving the steps of placing a substrate having the irradiated photoresist thereon at a first temperature in a rapid thermal anneal furnace; heating the substrate having the irradiated photoresist thereon to a second temperature within about 0.1 seconds to about 10 seconds; cooling the substrate having the irradiated photoresist thereon to a third temperature in a rapid thermal annealing furnace within about 0.1 seconds to about 10 seconds; and developing the irradiated photoresist, wherein the second temperature is higher than the first temperature and the third temperature.

In another embodiment, the present invention relates to a method of improving critical dimension control of a photoresist involving the steps of depositing the photoresist on a semiconductor substrate; selectively irradiating the photoresist; heating the semiconductor substrate having the irradiated photoresist thereon under an atmosphere containing an inert gas from a first temperature to a second temperature from about 20° C. to about 200° C. and cooling the semiconductor substrate having the irradiated photoresist thereon to a third temperature in a rapid thermal annealing furnace in a period of time from about 1 second to about 10 minutes; and developing the heated irradiated photoresist.

In yet another embodiment, the present invention relates to a a system of processing a photoresist, containing a source of actinic radiation and a mask for selectively irradiating a photoresist; a rapid thermal annealing furnace for rapidly heating and rapidly cooling a selectively irradiated photoresist, wherein the rapid heating and rapid cooling are independently conducted within about 0.1 seconds to about 10 seconds; and a developer for developing a rapid thermal annealing furnace heated and selectively irradiated photoresist into a patterned photoresist.

DISCLOSURE OF INVENTION

Figure 1:
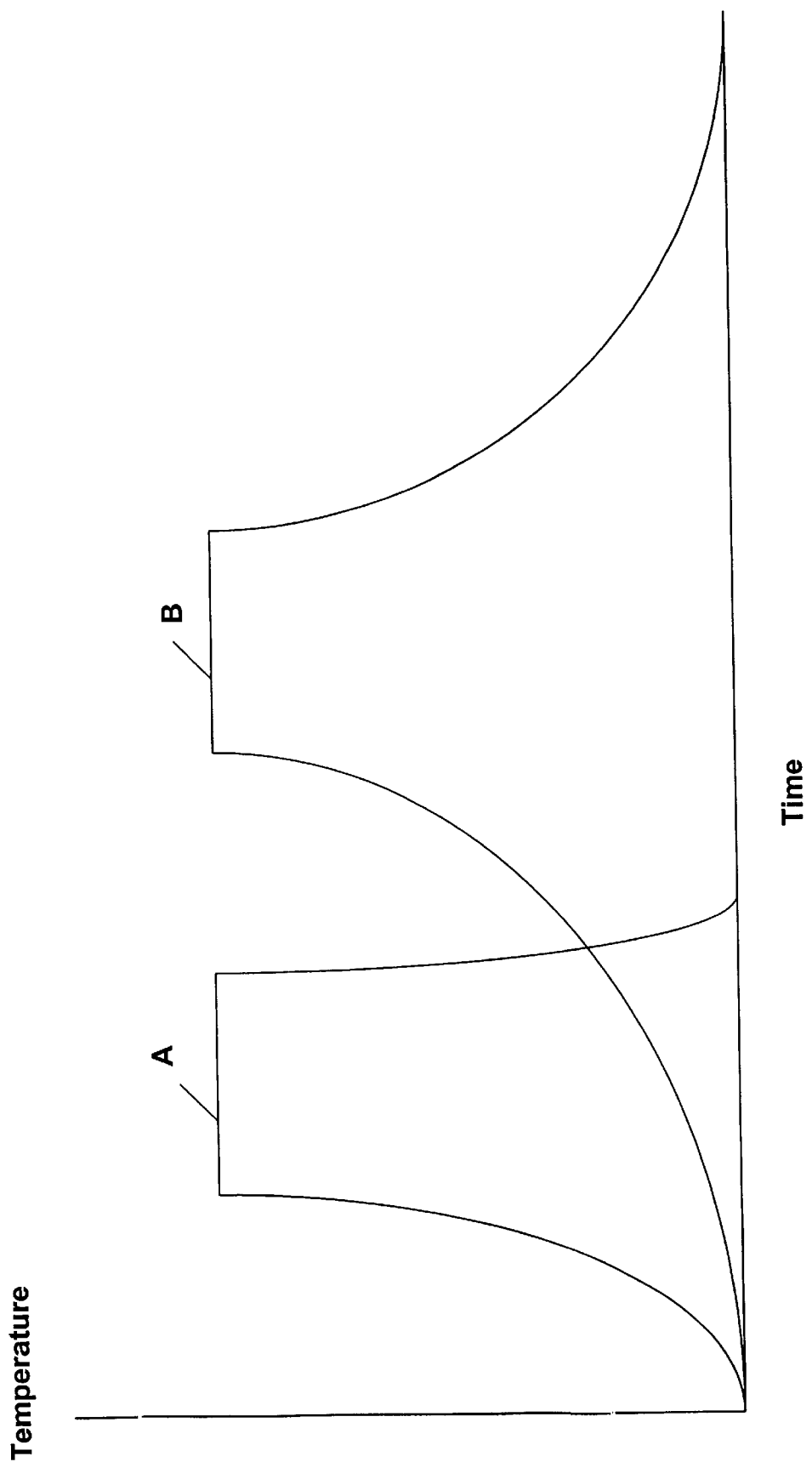
FIG. 1 illustrates graphically the difference in heating profiles between an RTA furnace which is used in accordance with the present invention and a conventional convection oven

The present invention involves using a rapid thermal annealing (RTA) furnace to controllably complete the chemical transformation in the exposed areas of the photoresist without deleteriously affecting any of characteristics of the resultant patterned photoresist. In other words, using an RTA furnace to perform the post bake exposure, critical dimension control of the resultant patterned photoresist is improved over using conventional convection ovens.

Initially, a photoresist is deposited over a portion of a semiconductor substrate or over all of the substrate. The substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

The photoresist may be deposited using any suitable means on the substrate. For example, the photoresist may be spin-coated on the substrate. The photoresist is applied to any suitable thickness as the thickness is not critical to the invention. In one embodiment, the photoresist is applied to a thickness from about 200 Å to about 30,000 Å. In another embodiment, the photoresist is applied to a thickness from about 1,000 Å to about 5,000 Å.

Positive or negative photoresists are employed. In one embodiment, the photoresist contains an acid catalyzed resin material. The acid catalyzed resin material undergoes a chemical change upon exposure to actinic radiation. Acid catalyzed or chemically amplified resist compositions generally comprise a photosensitive acid (photoacid) generator and a polymer. The polymer has acid sensitive side chain (pendant) groups which are bonded to the polymer backbone and are reactive towards a proton. Upon imagewise exposure to radiation or heat, the photoacid generator produces a proton. The proton causes catalytic cleavage of the pendant group from the polymer backbone. The proton is not consumed in the cleavage reaction and catalyzes additional cleavage reactions thereby chemically amplifying the photochemical response of the resist. The cleaved polymer is soluble in polar developers while the unexposed polymer is soluble in nonpolar organic solvents. Thus the resist can provide positive or negative images of the mask depending of the selection of the developer solvent.

Photoresists include an e-beam sensitive resist, a 157 nm sensitive resist, a 193 nm sensitive resist, an I-line resist, H-line resist, G-line resist, E-line resist, mid UV resist, deep UV resist or an extreme UV resist material. In one embodiment, the photoresist is a chemically amplified photoresist. Photoresists are commercially available from a number of sources, including Shipley Company, Kodak, Hoechst Celanese Corporation, Hunt, Aquamer, Arch Chemical, Clariant, JSR Microelectronics, and Brewer.

The photoresist is then exposed to an image-wise pattern of radiation (selected or predetermined portions of the photoresist are exposed to actinic radiation). A mask is typically employed to selectively irradiate the photoresist. Any suitable wavelength of radiation including e-beams may be employed to expose the photoresist. For example, radiation having wavelengths from about 1 nm to about 700 nm may be employed. Examples of wavelengths include 11 nm, 13 nm, 126 nm, 157 nm, 193 nm, 248 nm, 365 nm, 405 nm, 436 nm, and 633 nm.

The selectively irradiated photoresist covered substrate is heated in accordance with the present invention to a temperature suitable to induce and/or promote completion of the chemical transformation in the photoresist. Heating is conducted in an RTA furnace, not a conventional convection oven. An RTA furnace permits the use of short-time, high temperature processing. RTA processes are characterized by a high degree of uniform heating and cooling within a short period of time without significant thermal diffusion. RTA systems are generally structured so that wafers are thermally isolated so that radiant, not conductive, heating and cooling predominates.

Any suitable RTA system may be employed to heat the selectively irradiated photoresist covered substrate. An RTA system typically includes, at a minimum, an RTA chamber, a heat source for directing heating to the interior of the RTA chamber, and a temperature monitor for measuring the temperature in the RTA chamber.

Temperature uniformity is one of the primary design considerations in these systems so that thermal gradients, which cause numerous deleterious effects, are avoided. RTA systems use various heat sources including arc lamps, such as a xenon arc lamp, tungsten-halogen lamps, excimer lasers, and resistively-heated slotted graphite sheets. Any RTA heating source may be employed by the methods of the present invention.

One or more heat sources are positioned in any suitable array to effect very rapid and uniform heating and cooling. In this connection, in embodiments where lamps are employed as heat sources, they may be positioned symmetrically or asymmetrically about the RTA chamber. Lamps may be positioned in a linear array, a circular array, a random array, a hexagonal array, an oval array, a spiral array, and the like.

In one embodiment, the selectively irradiated photoresist covered substrate is heated to a temperature from about 20° C. to about 200° C. In another embodiment, the selectively irradiated photoresist covered substrate is heated to a temperature from about 40° C. to about 150° C. In yet another embodiment, the selectively irradiated photoresist covered substrate is heated to a temperature from about 50° C. to about 110° C.

The selectively irradiated photoresist covered substrate is heated for a suitable period of time to induce and/or promote completion of the chemical transformation in the photoresist. In one embodiment, the selectively irradiated photoresist covered substrate is heated for a period of time from about 1 second to about 10 minutes. In another embodiment, the selectively irradiated photoresist covered substrate is heated for a period of time from about 2 seconds to about 2 minutes. In yet another embodiment, the selectively irradiated photoresist covered substrate is heated for a period of time from about 5 seconds to about 60 seconds.

Using an RTA furnace, the total heating time, measured from the moment is started to the moment the irradiated photoresist covered substrate returns to its preheating temperature is substantially shorter than that associated with using a convection oven. In one embodiment, the total heating time is from about 1 second to about 10 minutes. In another embodiment, the total heating time is from about 2 seconds to about 2 minutes. In yet another embodiment, the total heating time is from about 5 seconds to about 60 seconds.

RTA processes are characterized by a high degree of heating within a short period of time without significant thermal diffusion. The time it takes the irradiated photoresist covered substrate to either reach its heated temperature or return from a heated temperature to its preheating temperature is typically on the order of about 0.1 seconds to about 10 seconds. In another embodiment, the time it takes the irradiated photoresist covered substrate to either reach its heated temperature or return from a heated temperature to its preheating temperature is from about 0.5 seconds to about 5 seconds. In yet another embodiment, the time it takes the irradiated photoresist covered substrate to either reach its heated temperature or return from a heated temperature to its preheating temperature is from about 1 second to about 3 seconds.

The preheated temperature and/or postheated temperature (cooled temperature) are typically room temperature (about 22° C. to about 27° C.). In another embodiment, the preheated and/or postheated temperature are from about 20° C.

to about 30° C. In yet another embodiment, the preheated and/or postheated temperature are from about 15° C. to about 35° C. The preheated temperature and postheated temperature may be different or about the same. The preheated temperature may be higher or lower than the postheated temperature.

Referring to FIG. 1, the differences between using an RTA furnace and a conventional convection oven are graphically illustrated by side-by-side heating profiles. In the graph, heating time is measured on the x-axis whereas heating temperature is measured on the y-axis. Heating profile curve A represents the heating profile of an RTA furnace and heating profile curve B represents the heating profile of a conventional convection oven. The graph illustrates that the heating profile curve of an RTA furnace reaches its operating temperature more quickly than the heating profile curve of a conventional convection oven, and similarly, the heating profile curve of an RTA furnace cools down to room temperature from its operating temperature much faster than the heating profile curve of a conventional convection oven.

Any suitable atmosphere for heating an irradiated photoresist covered substrate may be employed, so as not to substantially degrade the irradiated photoresist. The atmosphere contains typically a major amount (more than 50% by volume) one or more inert gases, a vacuum, and optionally minor amounts (less than about 10% by volume) of other gases. Inert gases include the noble gases, such as helium, neon, argon, krypton and xenon, and nitrogen. In one embodiment, the RTA furnace atmosphere is a vacuum or contains one or more inert gases.

In one embodiment, the RTA furnace is incorporated into a track system. The track system facilitates movement of the wafers between processing chambers/stations, typically using one or more robots positioned on a conveyer belt system. In this embodiment, the RTA furnace is positioned in close proximity to the stepper, and the track system efficiently transfers the wafer from the stepper to the RTA furnace. The track system can also efficiently transfer the wafer to a developing station.

Figure 2:
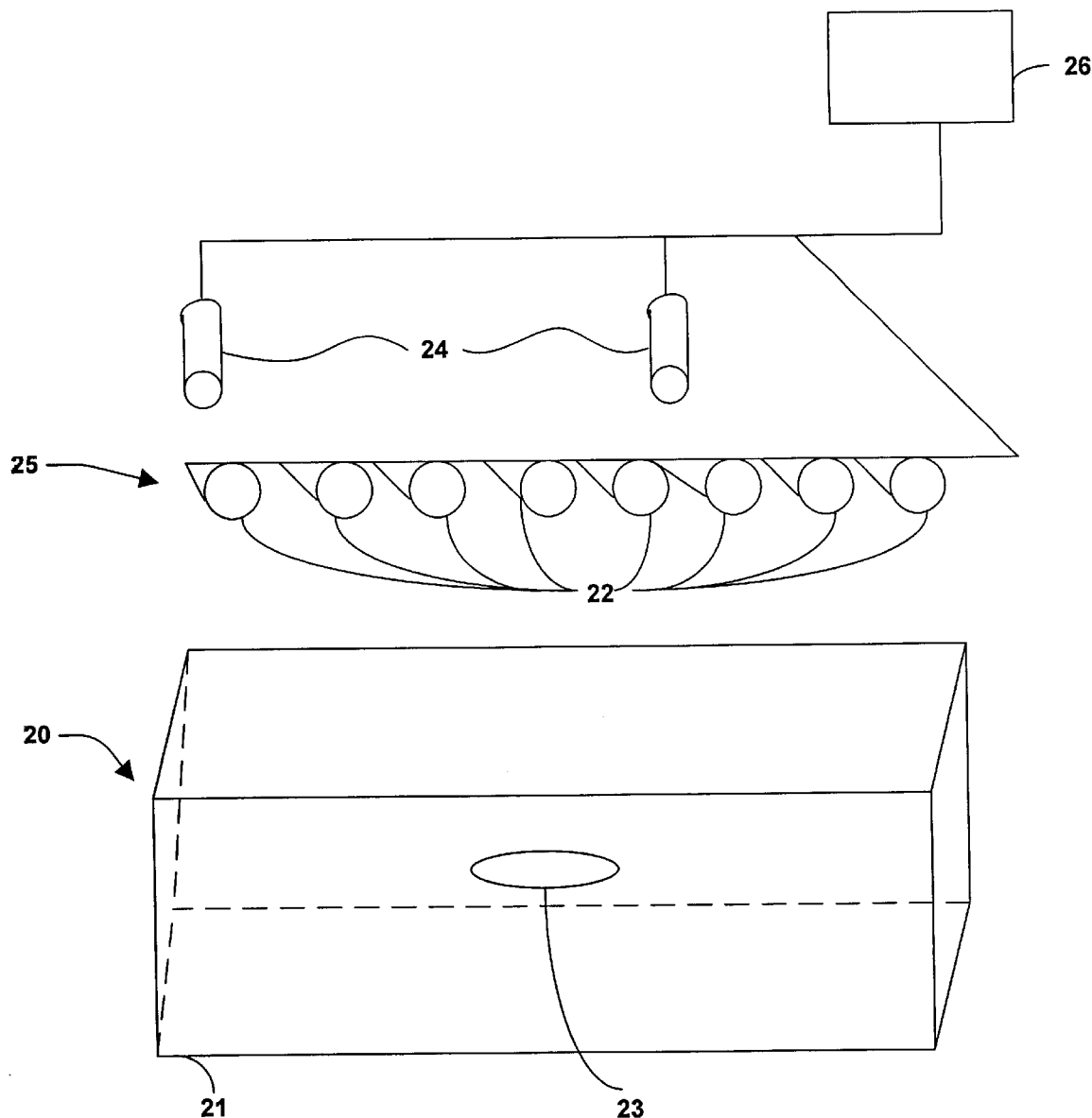
FIG. 2 illustrates a schematic view of an RTA furnace system in one aspect of the present invention.

Referring to FIG. 2, a schematic diagram illustrates an RTA furnace or system system 20 including an RTA chamber 21, a plurality of lamps 22 for heating a semiconductor wafer 23 within the RTA chamber 21, a temperature monitor 24 for monitoring the heating of the semiconductor wafer 23. The RTA system 20 further includes a control circuit 26 controllably connected to the plurality of lamps 22. As the temperature is monitored, feedback control is used to control heating by the lamps 22.

The control circuit 26 receives signals indicative of the temperature within the RTA chamber 21. The control circuit 26 includes switches and an adjuster for controlling the time and intensity of heating. RTA chamber 21 is a heating chamber supplying a controlled environment for the semiconductor wafer 23 and for supplying energy from the lamps 22 to the semiconductor wafer 23. The RTA chamber 21 forms an air-tight structure so that heating is supplied under controlled atmospheric conditions.

A plurality of lamps 22, such as arc lamps, tungsten-halogen lamps and the like, are arranged about the RTA chamber 21. In the illustrative RTA system 20, the lamps 22 are arranged in a suitable linear array 25. In other embodiments, the lamps 22 are arranged in other suitable formations including, for example, an hexagonal array of lamps. The lamps 22 have a controlled intensity. In one embodiment, all lamps are controlled commonly. In another embodiment, each lamp is individually controlled. Switched incoherent heat sources are typically used although coherent heat sources may also be used.

After heating the selectively irradiated photoresist covered substrate, the photoresist is developed. Development involves removing the exposed or unexposed portions of the photoresist. Any suitable developer may be used to remove the exposed or unexposed portions of the photoresist including aqueous alkaline developers. Aqueous alkaline developers typically contain a hydroxide compound, such as tetramethylammonium hydroxide. Development yields a patterned photoresist with improved critical dimension control.

While not wishing to be bound by any theory, it is believed that the rapid heating and rapid cooling in the RTA furnace promotes accurate completion of the chemical transformation in the irradiated portions of the photoresist (the chemical transformation is not incomplete and/or overdone). As a result, the unwanted effects, such as structural degradation, dopant diffusion, and phase changes, that may occur at high processing temperatures in conventional convection ovens is avoided. Using an RTA furnace, unwanted effects, such as structural degradation, dopant diffusion, and phase changes, that may occur at high processing temperatures in convection ovens, are avoided. Cooling the heated selectively irradiated photoresist within the RTA furnace chamber instead of the open air also is believed to contribute the ability of the methods of the present invention to improve critical dimension control.

Particularly, it is believed that failure to quickly cool a heated selectively irradiated photoresist causes a loss of critical dimension control. This loss of critical dimension control is unacceptable given the continuing trend towards increased integration and miniaturization in the semiconductor industry.

One specific embodiment of the methods of the present invention is now described in connection with FIG. 2. A semiconductor substrate is provided with a selectively irradiated acid catalyzed photoresist over the substrate 23 in RTA chamber 21 of RTA furnace 20. Although not shown, photoresist covered substrate 23 may include any suitable semiconductor material (one or more layers of semiconductor materials), for example, a monocrystalline silicon substrate. Also, although not shown, photoresist covered substrate 23 may include of one or more layers including substrate layers, diffusion regions, dielectric layers such as oxides, devices, polysilicon layers, and the like.

Tungsten halogen lamps 22 are employed to heat the photoresist covered substrate 23 to a temperature of 160° C. for 40 seconds. The photoresist covered substrate 23 takes about 2 seconds to reach the temperature of 160° C. (from room temperature) and about 2 seconds to return to room temperature from the temperature of 160° C. Although not shown, the photoresist covered substrate 23 is then developed where a patterned photoresist covered substrate with improved critical dimension control is obtained.

Although not shown, the RTA furnace 20 may be part of a track system. The track system efficiently transfers the photoresist covered substrate 23 from the stepper, where selective irradiated is conducted, to the RTA furnace 20. The track system then efficiently transfers the photoresist covered substrate 23 to a developing station.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing an irradiated photoresist comprising:

placing a substrate having the irradiated photoresist thereon at a first temperature in a rapid thermal anneal furnace;

heating the substrate having the irradiated photoresist thereon to a second temperature within about 0.1 seconds to about 10 seconds;

cooling the substrate having the irradiated photoresist thereon to a third temperature in a rapid thermal annealing furnace within about 0.1 seconds to about 10 seconds; and developing the irradiated photoresist, wherein the second temperature is higher than the first temperature and the third temperature.

2. The method of claim 1, wherein the first temperature and the third temperature are from about 15° C. to about 35° C. and the second temperature is from about 20° C. to about 200° C.

3. The method of claim 1, wherein the first temperature and the third temperature are from about 20° C. to about 30° C. and the second temperature is from about 40° C. to about 150° C.

4. The method of claim 1, wherein heating and cooling are conducted under an atmosphere comprising an inert gas.

5. The method of claim 1, wherein the substrate having the irradiated photoresist thereon is heated at the second temperature for a period of time from about 2 seconds to about 2 minutes.

6. The method of claim 1, wherein the photoresist comprises at least one of an e-beam sensitive resist, a 157 nm sensitive resist, a 193 nm sensitive resist, an I-line resist, H-line resist, G-line resist, E-line resist, mid UV resist, deep UV resist and an extreme UV resist.

7. The method of claim 1, wherein the photoresist comprises a chemically amplified photoresist.

8. A method of improving critical dimension control of a photoresist comprising:

depositing the photoresist on a semiconductor substrate;

selectively irradiating the photoresist;

heating the semiconductor substrate having the irradiated photoresist thereon under an atmosphere comprising an inert gas from a first temperature to a second temperature from about 20° C. to about 200° C. and cooling the semiconductor substrate having the irradiated photoresist thereon to a third temperature in a rapid thermal annealing furnace in a period of time from about 1 second to about 10 minutes; and developing the heated irradiated photoresist.

9. The method of claim 8, wherein the semiconductor substrate having the irradiated photoresist thereon is heated to a temperature from about 50° C. to about 110° C. for a period of time from about 5 seconds to about 60 seconds.

10. The method of claim 8, wherein the first temperature and the third temperature are from about 15° C. to about 35° C.

11. The method of claim 9, wherein the substrate having the irradiated photoresist thereon is heated to the second temperature from the first temperature within about 0.5 seconds to about 5 seconds.

12. The method of claim 8, wherein the substrate having the irradiated photoresist thereon is cooled to the third temperature from the second temperature within about 0.5 seconds to about 5 seconds.

13. The method of claim 8, wherein the photoresist comprises an acid catalyzed resin material.

14. The method of claim 1, wherein the substrate is heated using one of arc lamps, tungsten-halogen lamps, excimer lasers, and resistively-heated slotted graphite sheets.

15. The method of claim 8, wherein the photoresist is selectively irradiated with one of e-beams, 11 nm light, 13 nm light, 126 nm light, 157 nm light, 193 nm light, 248 nm light, 365 nm light, 405 nm light, 436 nm light, and 633 nm light.

16. The method of claim 8, wherein the photoresist is a positive photoresist or a negative photoresist.

17. The method of claim 1, wherein the heating and cooling are independently conducted within about 0.5 seconds to about 5 seconds.

* * * * *